(12) United States Patent
Cheng et al.

(10) Patent No.: US 9,142,607 B2
(45) Date of Patent: Sep. 22, 2015

(54) METAL-INSULATOR-METAL CAPACITOR

(75) Inventors: Xu Cheng, Chandler, AZ (US); Todd C. Roggenbauer, Austin, TX (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/403,743

(22) Filed: Feb. 23, 2012

(65) Prior Publication Data

US 2013/0221482 A1 Aug. 29, 2013

(51) Int. Cl.
*H01L 29/92* (2006.01)
*H01L 49/02* (2006.01)
*H01L 21/02* (2006.01)

(52) U.S. Cl.
CPC .............. *H01L 28/40* (2013.01); *H01L 28/87* (2013.01)

(58) Field of Classification Search
USPC ........................................................ 257/532
See application file for complete search history.

(56) References Cited

U.S. PATENT DOCUMENTS

| | | | |
|---|---|---|---|
| 5,926,359 A | 7/1999 | Greco et al. |
| 6,274,435 B1 | 8/2001 | Chen |
| 6,300,682 B2 | 10/2001 | Chen |
| 6,387,750 B1 | 5/2002 | Lai et al. |
| 6,436,787 B1 | 8/2002 | Shih et al. |
| 6,461,914 B1 | 10/2002 | Roberts et al. |
| 6,624,040 B1 | 9/2003 | Ng et al. |
| 6,635,527 B1 | 10/2003 | Greco et al. |
| 6,699,749 B1 | 3/2004 | Lee et al. |
| 6,717,193 B2 | 4/2004 | Olewin et al. |
| 6,753,618 B2 | 6/2004 | Basceri et al. |
| 6,765,255 B2 | 7/2004 | Jin et al. |
| 6,849,387 B2 | 2/2005 | Chiang et al. |
| 6,881,642 B2 | 4/2005 | Basceri et al. |
| 6,897,510 B2 | 5/2005 | Tseng |
| 6,927,440 B2 | 8/2005 | Greco et al. |
| 6,999,298 B2 | 2/2006 | Hackler, Sr. et al. |
| 7,030,443 B2 | 4/2006 | Hino et al. |
| 7,084,042 B2 | 8/2006 | Olewine et al. |
| 7,235,453 B2 | 6/2007 | Kim |

(Continued)

OTHER PUBLICATIONS

Chit Hwei Ng, Chaw-Sing Ho, Member, IEEE, Shao-Fu Sanford Chu, and Shi-Chung Sun, Senior Member, IEEE, MIM Capacitor Integration for Mixed-Signal/RF Applications, Jul. 2005, IEEE, vol. 52, No. 7, pp. 1399-1409.*

(Continued)

*Primary Examiner* — Zandra Smith
*Assistant Examiner* — Lawrence Tynes, Jr.

(57) ABSTRACT

A capacitor suitable for inclusion in a semiconductor device includes a substrate, a first metallization level, a capacitor dielectric, a capacitor plate, an interlevel dielectric layer, and a second metallization level. The first metallization level overlies the substrate and includes a first metallization plate overlying a capacitor region of the substrate. The capacitor dielectric overlies the first metallization plate and includes a dielectric material such as a silicon oxide or silicon nitride compound. The capacitor plate is an electrically conductive structure that overlies the capacitor dielectric. The interlevel dielectric overlies the capacitor plate. The second metallization layer overlies the interlevel dielectric layer and may include a second metallization plate and a routing element. The routing element may be electrically connected to the capacitor plate. The metallization plates may include a fingered structure that includes a plurality of elongated elements extending from a cross bar.

6 Claims, 3 Drawing Sheets

(56) References Cited

U.S. PATENT DOCUMENTS

| | | |
|---|---|---|
| 7,268,038 B2 | 9/2007 | Dornisch et al. |
| 7,368,343 B2 | 5/2008 | Yang |
| 7,378,719 B2 | 5/2008 | Yang |
| 7,435,641 B2 | 10/2008 | Yang |
| 7,456,072 B2 | 11/2008 | Olewine et al. |
| 7,906,832 B2 | 3/2011 | Kageyama |
| 7,968,408 B2 | 6/2011 | Lee |
| 7,981,761 B2 | 7/2011 | Imai et al. |
| 8,017,997 B2 | 9/2011 | Divakaruni et al. |
| 2001/0010955 A1 | 8/2001 | Chen |
| 2002/0074584 A1 | 6/2002 | Yang |
| 2002/0192904 A1 | 12/2002 | Yang |
| 2003/0028200 A1 | 2/2003 | Berg et al. |
| 2003/0067023 A1 | 4/2003 | Olewine et al. |
| 2003/0113974 A1 | 6/2003 | Ning et al. |
| 2003/0156378 A1 | 8/2003 | Chiang et al. |
| 2003/0168750 A1 | 9/2003 | Basceri et al. |
| 2003/0183862 A1 | 10/2003 | Jin et al. |
| 2003/0205729 A1 | 11/2003 | Basceri et al. |
| 2003/0218200 A1* | 11/2003 | Lee ............................... 257/306 |
| 2004/0219757 A1 | 11/2004 | Olewine et al. |
| 2005/0037568 A1 | 2/2005 | Greco et al. |
| 2005/0048713 A1 | 3/2005 | Tseng |
| 2005/0063140 A1 | 3/2005 | Hackler, Sr. et al. |
| 2005/0110068 A1 | 5/2005 | Hino et al. |
| 2005/0142851 A1 | 6/2005 | Kim |
| 2005/0263848 A1 | 12/2005 | Cho |
| 2006/0110889 A1 | 5/2006 | Dornisch et al. |
| 2006/0160301 A1 | 7/2006 | Shim |
| 2006/0216901 A1 | 9/2006 | Olewine et al. |
| 2007/0013029 A1* | 1/2007 | Iioka et al. .................... 257/532 |
| 2007/0026625 A1 | 2/2007 | Chung et al. |
| 2007/0228506 A1* | 10/2007 | Min et al. ....................... 257/499 |
| 2008/0057663 A1 | 3/2008 | Yang |
| 2008/0057664 A1 | 3/2008 | Yang |
| 2008/0064147 A1 | 3/2008 | Iizuka et al. |
| 2008/0064179 A1 | 3/2008 | Yang |
| 2008/0157277 A1* | 7/2008 | Park et al. ...................... 257/532 |
| 2009/0029519 A1 | 1/2009 | Lee |
| 2009/0200638 A1 | 8/2009 | Smith |
| 2009/0267184 A1 | 10/2009 | Olewine et al. |
| 2010/0163949 A1 | 7/2010 | Divakaruni et al. |
| 2010/0164063 A1 | 7/2010 | Yun |
| 2011/0147890 A1 | 6/2011 | Kageyama |
| 2011/0298025 A1 | 12/2011 | Haensch et al. |

OTHER PUBLICATIONS

Hg, Chit Hwei, Ho, Chaw-Sing, Chu, Shao-Fu Sanford, Sun, Shi-Chung, MIM Capacitor Integration for Mixed-Signal/FR Applications, IEEE Transactions on Electron Devices, vol. 52, No. 7, Jul. 2005, pp. 1399-1409.

\* cited by examiner

METAL-INSULATOR-METAL CAPACITOR

BACKGROUND

1. Field

The disclosed subject matter is in the field of semiconductor devices and, more particularly, semiconductor devices that include integrated capacitors.

2. Related Art

Semiconductor devices such as radio frequency (RF) devices and other devices that include analog or mixed signal functions may require one or more capacitors. The formation of these capacitors may be integrated into the semiconductor fabrication process used to form the semiconductor devices, typically using a metal-insulator-metal (MIM) capacitor structure. As suggested by its name, a MIM capacitor may include a pair of metallic capacitor plates above and below a capacitor dielectric. The fabrication of a MIM capacitor may leverage one or more steps from an existing semiconductor fabrication process and various architectures have been proposed for integrating MIM capacitors into existing fabrication processes.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
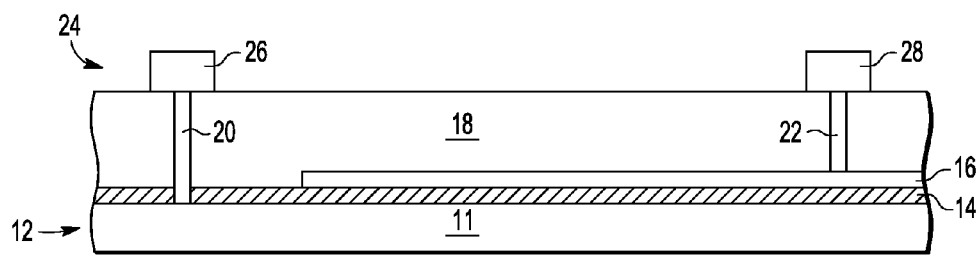
FIG. 1 is a partial cross-sectional representation of a first integrated MIM capacitor according to the prior art.

Turning now to the drawings, FIG. 1 depicts selected elements of a prior art MIM capacitor 10. MIM capacitor 10 as depicted in FIG. 1 employs a portion of a first metallization layer 12 as a metallization plate 11 and includes a capacitor dielectric 14 overlying metallization plate 11. A capacitor plate 16 overlies capacitor dielectric 14 and an interlevel dielectric layer 18 overlies capacitor plate 16 and exposed portions of capacitor dielectric 14. A first via 20 and a second via 22 are formed in interlevel dielectric layer 18. First via 20 contacts metallization plate 11 while second via 22 contacts capacitor plate 16. A second metallization level 24 formed overlying interlevel dielectric layer 18 is patterned to form capacitor electrodes 26 and 28, respectively connected to metallization plate 11 and capacitor plate 16 through first via 20 and second via 22.

Figure 2:
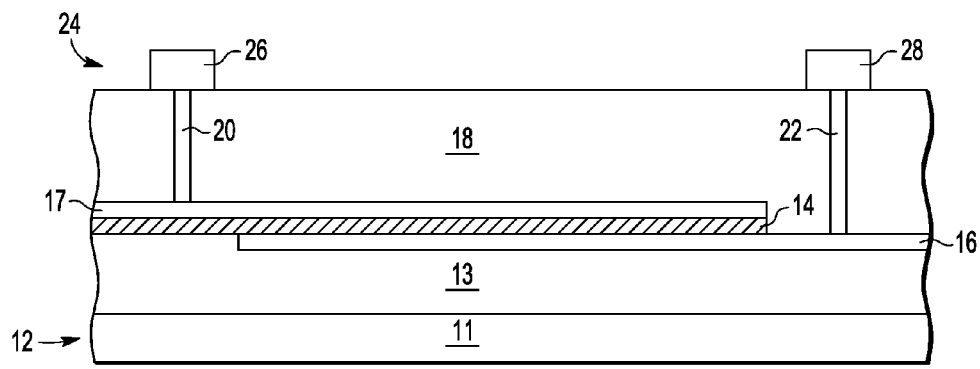
FIG. 2 is a partial cross-sectional representation of a second integrated MIM capacitor according to the prior art.

Turning to FIG. 2, a second embodiment of integrated MIM capacitor 10 includes additional structural elements dedicated to the integrated capacitor. As depicted in FIG. 2, integrated capacitor 10 includes an additional capacitor plate 17 overlying capacitor dielectric 14. In the embodiment depicted in FIG. 2, a first interlevel dielectric layer 13 is formed over metallization plate 11 of first metallization level 12 and first capacitor plate 16 is formed in interlevel dielectric layer 13. A capacitor dielectric 14 overlies first capacitor plate 16 while a second capacitor plate 17 is formed overlying capacitor dielectric 14. The first via 20 is connected to second capacitor plate 17 while second via 22 is connected to first capacitor plate 16. First capacitor electrode 26 of second metallization level 24 connects to first capacitor plate 17 via first via 20 while second capacitor electrode 28 connects to first capacitor plate 16 through via 22.

Although integrated MIM capacitors 10 as depicted in FIG. 1 and FIG. 2 may achieve a serviceable capacitor, the capacitive density of the structure may not be sufficient or optimal for current or future fabrication processes. As geometries decrease, the magnitude of a capacitor structure may be maintained by increasing the capacitive density of the structure.

In one aspect, a capacitive structure suitable for inclusion in a semiconductor device is disclosed. Some embodiments of the capacitive structure include a substrate, a first metallization level, a capacitor dielectric, a capacitor plate, an interlevel dielectric layer, and a second metallization level. The substrate includes a capacitor region and a non-capacitor region referred to herein as a field region. The first metallization level overlies the substrate and includes a first metallization plate overlying the capacitor region. The capacitor dielectric overlies the first metallization plate and includes a dielectric material such as a silicon dioxide or another silicon-oxygen compound, silicon nitride or another silicon-nitrogen compound, a high-K dielectric, or a combination thereof. The capacitor plate is an electrically conductive structure that overlies the capacitor dielectric. The capacitor plate may include one or more semiconductor materials such as heavily doped silicon, one or more metal materials such as aluminum, copper, tantalum nitride, titanium nitride, and the like, one or more silicide materials such as WTi, or a combination thereof.

The interlevel dielectric overlies the capacitor plate and may be formed of a conventional interlevel dielectric layer material such as a silicon-oxide compound, silicon nitride, a high K-material, or the like. The second metallization layer is formed overlying the interlevel dielectric layer and, in some embodiments, includes a second metallization plate and a routing element. The second metallization plate overlies the capacitor region while the routing element overlies a field region of the substrate where the capacitor region and field region are mutually exclusive. The routing element may be electrically connected to the capacitor plate.

Either or both of the metallization plates may include a fingered structure. In some embodiments, the fingered structure includes a plurality of flanges or elongated elements extending from a common connector or cross bar. In some embodiments, the fingered structure includes a plurality of rectangular fingers, each having a finger width and a finger length. Each adjacent pair of fingers may be separated by a finger spacing. In some embodiments, a ratio of the finger width to the finger spacing is the maximum permitted by the fabrication process. In fabrication processes that specify this parameter as a minimum spacing-to-period ratio, where the period includes the sum of the spacing and the finger width, the minimum spacing-to-period ratio may be approximately 20% and, therefore, the maximum width to spacing ratio is approximately equal to 4.

The capacitive structure may include an electrically conductive via connecting the routing element to the capacitor plate. The capacitive structure may also include a second capacitor dielectric overlying the first capacitor plate and underlying the interlevel dielectric layer and a second capacitor plate overlying the second capacitor dielectric and underlying the interlevel dielectric layer. The second metallization plate may be electrically connected to the routing element. The first metallization plate may be connected to the second capacitor plate. In some embodiments, the first metallization plate is connected to the second capacitor plate via a bridge routing element in the second metallization level.

In another aspect, a disclosed semiconductor device includes an integrated capacitor suitable for use in a variety of analog and mixed signal applications. The integrated capacitor may include first and second electrically conductive potential elements. The first potential element may include a first metallization plate overlying a capacitor region of the substrate. The second potential element may include a capacitor plate overlying the first metallization plate. The semiconductor device may further include a second metallization plate. The second metallization plate may be connected to the first potential element or the second potential element. One or both of the first metallization plate and the second metallization plate may include a fingered structure.

The semiconductor device may include a second capacitor plate overlying a second capacitor dielectric overlying the first capacitor plate. In these embodiments, the first potential element may include a combination of the first metallization plate and the second capacitor plate and the second potential element may include a combination of the first capacitor plate and the second metallization plate. In some embodiments, the fingered structure includes a plurality of elongated elements extending from a cross bar. The elongated elements may be separated by a gap. In these embodiments, a width of the gap may relatively small compared to a width of the elongated elements. The elongated elements may extend substantially in parallel with each other such that a separation between adjacent elongated elements remains fixed along a length of the elongated elements from the cross bar to the ends of the elongated elements.

In another aspect, a disclosed semiconductor fabrication process includes forming a first metallization level overlying a substrate. The substrate includes a capacitor region and a field region and the first metallization level includes a first metallization plate overlying the capacitor region. The process may further include forming a capacitor dielectric overlying the first metallization plate, forming a capacitor plate overlying the capacitor dielectric, and forming an interlevel dielectric layer overlying the capacitor plate. A second metallization level may then be formed overlying the interlevel dielectric layer. The second metallization level may include a second metallization plate overlying the capacitor region. One or both of the first metallization level and the second metallization level may be patterned to define fingered structures. A fingered structure may include a plurality of finger elements separated by a minimum spacing. In some embodiments, a second capacitor plate overlying the second capacitor dielectric may be formed prior to forming the interlevel dielectric layer. In some embodiments, the fingered structure is configured to achieve a metallization density substantially equal to or close to a maximum metallization density that the process supports.

Figure 3:
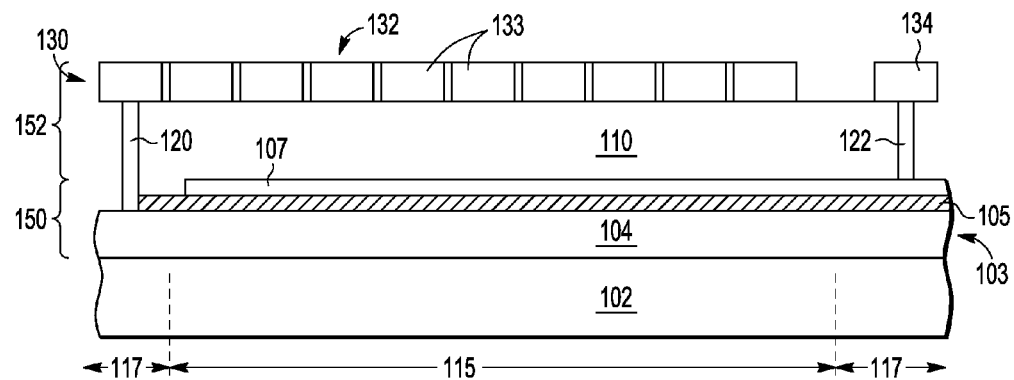
FIG. 3 is a partial cross-sectional representation of a first integrated MIM capacitor including a fingered structure.

Referring now to FIG. 3, selected elements of an embodiment of an integrated MIM capacitor structure 100 are depicted in cross-sectional view. In the embodiment depicted in FIG. 3, integrated MIM capacitor structure 100 is formed on a semiconductor substrate 102. Semiconductor substrate 102 may include one or more previous metallization layers as well as any or all front end structures and devices including one or more transistors and structures for electrically isolating the various transistors as will be appreciated by those of skill in the field of semiconductor fabrication. As such, substrate 102 may include bipolar junction transistors, field effect transistors including metal-oxide-semiconductor field effect transistors, or a combination thereof. Substrate 102 may include a semiconductor bulk substrate (not expressly depicted) comprised of crystalline silicon or another semiconductor element or compound. Semiconductor substrate 102 may an epitaxial layer (not depicted) overlying a bulk semiconductor region, a buried oxide layer (not depicted) underlying semiconductor substrate 102, or both. Semiconductor substrate 102 may further include one or more well structures (not depicted) formed in the epitaxial layer or bulk substrate.

As depicted in FIG. 3, substrate 102 includes a capacitor region 115 and a non-capacitor region, also referred to herein as a field region 117. Capacitor region 115 defines an area or region of substrate 102 over which an integrated MIM capacitor structure may be formed while field region 117 designates an area or region of substrate 102 over which routing, as an example, may be formed.

As depicted in FIG. 3, integrated MIM capacitor structure 100 includes a first metallization plate 104 where first metallization plate 104 is an element of a first metallization level 103 that overlies substrate 102. In some embodiments, first metallization level 103, in addition to including first metallization plate 104, includes metallization routing elements for interconnecting transistors and other device elements (not depicted in FIG. 3) exterior to capacitor region 115. In these embodiments, it will be appreciated that the formation of first metallization plate 104 requires no additional processing with respect to a fabrication process that does not employ MIM capacitors. In other words, the fabrication of integrated MIM capacitor structure 100 leverages process steps for forming a first metallization level to form first metallization plate 104. First metallization level 103 may be formed according to any of various techniques for forming metallization layers. In some embodiments, first metallization level 103 may be an inlaid metallization process in which an interlevel dielectric layer (not depicted in FIG. 3) is deposited and patterned to form trenches. In these embodiments, the trenches are filled with a metallization material, which may be deposited using a chemical vapor deposition or physical vapor deposition process, an electroplating process, or another suitable process. The material of first metallization level 103 may be any of various electrically conductive materials including, as examples, aluminum, copper, various silicide materials including, as an example, WSi, or various other materials.

Some embodiments of integrated MIM capacitor structure 100 described herein include one or more capacitive plate structures that employ a structure referred to herein as a fingered structure to increase the capacitive density of the integrated MIM capacitor structure 100. In the embodiment depicted in FIG. 3, a fingered structure is included within a second metallization level 130 (described below), but not included in the first metallization level 103. In other embodiments, fingered structures may be included in both of the metallization layers (such as in FIG. 5) while, in still other embodiments (not depicted), a fingered structure may be used in first metallization level 103, but not in the second metallization level 130. Finally, in some embodiments (not depicted), neither of the metallization plates (104, 135) of MIM capacitor structure 100 are fingered structures. In these embodiments, the metallization plates (104, 135) may have the structure of a convex plate including, as an example, a rectangular plate, that underlies, in the case of first metallization plate 104, or overlies, in the case of second metallization plate 135, all of or a substantial portion of capacitor region 115.

The first metallization level 103 as show in FIG. 3 includes or defines a first metallization plate 104 that provides a conductive plate for integrated MIM capacitor structure 100. In this embodiment, the first metallization plate 104 occupies a portion of first metallization level 103 overlying the capacitor region 115 of substrate 102.

A MIM capacitor dielectric 105 is depicted overlying first metallization plate 104 within capacitor region 115 of substrate 102. Various dielectric materials may be used for capacitor dielectric 105. In some embodiments, for example, capacitor dielectric 105 may include silicon nitride, a silicon-oxide compound, or both. In other embodiments, capacitor dielectric 105 may include a high-K material such as hafnium silicate, zirconium silicate, hafnium dioxide and zirconium dioxide, typically deposited using atomic layer deposition. Although it is possible that the formation of capacitor dielectric 105 may leverage preexisting process steps for forming dielectric structures outside of capacitor region 115, capacitor dielectric 105 is, in at least some embodiments, unique to semiconductor region 115 and the formation of capacitor dielectric 105 requires a dedicated set of fabrication steps.

A MIM capacitor plate 107 of integrated MIM capacitor structure 100 as depicted in FIG. 1 overlies capacitor dielectric 105 within capacitor region 115 of substrate 102. Capacitor plate 107 is an electrically conductive film that functions as a conductor plate for the integrated MIM capacitor structure 100. In some embodiments, capacitor plate 107 is formed by known deposition and etch techniques. Like first metallization plate 104, capacitor plate 107 may be aluminum, copper, silicide, another suitable conductive thin film material, or a combination thereof. As was true for capacitor dielectric 105, it is possible that the formation of capacitor plate 107 may leverage preexisting process steps for forming conductive structures outside of capacitor region 115, capacitor plate 107 is, in at least some embodiments, unique to semiconductor region 115 and the formation of capacitor plate 107 requires a dedicated set of fabrication steps.

An interlevel dielectric layer 110 is shown formed overlying capacitor plate 107 and an exposed portion of capacitor dielectric 105. In some embodiments, interlevel dielectric layer 110 is formed using conventional interlevel dielectric layer processes and materials. In these embodiments, depending upon the application, interlevel dielectric layer 110 may include a thermally formed silicon oxide, a low-K material such as fluorosilicate glass, a high-k material such as any of the high-K materials referred to in the preceding discussion or another suitable material. Although a high-K material may be desirable from the perspective of increasing capacitive density, a high-k material may not be suitable for use as an interlevel dielectric layer in field (non-capacitor) regions 117, where a high-k interlevel dielectric layer may increase the magnitude of unwanted capacitances include parasitic capacitances between adjacent metallization layers.

FIG. 3 depicts a first via 120 and a second via 122 formed within interlevel dielectric layer 110. In some embodiments, vias 120 and 122 are formed by etching vertically oriented voids in interlevel dielectric layer 110 and filling the voids with a conductive via material such as TiN or another suitable material. A second metallization level 130 is shown formed overlying interlevel dielectric layer 110. Like first metallization level 103, second metallization level 130 may include a metal material such as aluminum, copper, or the like, a conductive silicide material such as WTi, a conductive silicon material such as heavily doped polysilicon, or a combination thereof.

Second metallization level 130 as depicted in FIG. 3 includes a second metallization plate 132 overlying the capacitor region 115 of semiconductor substrate 102 and a routing element 134. Routing element 134 is shown connected to capacitor plate 107 through via 122 while second metallization plate 132 is shown connected to first metallization plate 104 through via 120. The embodiment of second metallization level 130 as shown includes a fingered structure described in more detail below. As was true for first metallization level 103 and first metallization plate 104, the fabrication of second metallization plate 132 may leverage a set of metallization processes for fabricating a second level of interconnect metallization and second metallization level 130 may therefore include interconnect elements (not depicted) exterior to capacitor region 115.

Integrated MIM capacitor structure 100 may be characterized, modeled, or described as including two capacitors arranged in parallel where the two capacitors include a MIM capacitor 150 and a parasitic capacitor 152. The two capacitors are in parallel because the voltage or potential applied across the capacitor plates of the two capacitors is the same. Using this terminology, first metallization plate 104 serves as a first MIM capacitor plate of MIM capacitor 150, MIM dielectric layer 105 serves as the MIM capacitor dielectric, and MIM capacitor plate 107 serves as a second MIM capacitor plate. With respect to parasitic capacitor 152, MIM capacitor plate 107 serves as a first parasitic capacitor plate, second metallization plate 132 serves as a second parasitic capacitor plate, and interlevel dielectric layer 110 functions as the capacitor dielectric for parasitic capacitor 152.

Figure 4:
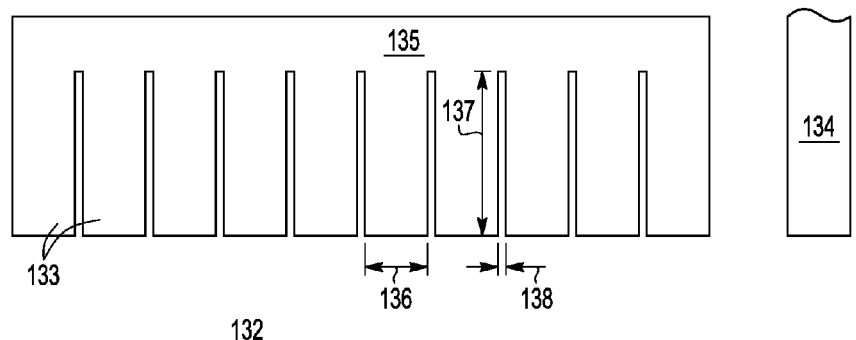
FIG. 4 is a top view of the MIM capacitor of FIG. 3.

Referring to FIG. 4, a top view of the integrated MIM capacitor structure 100 of FIG. 3 is presented. As depicted in FIG. 4, second metallization plate 132 is an electrically continuous structure that includes a plurality of elongated members or fingers 133 connected to a cross bar 135 at one end of the fingers 133. As depicted in FIG. 4, fingers 133 are uniformly sized rectangles having a finger width 136, a finger length 137, and a gap or spacing 138 between adjacent fingers 133.

Although the embodiment of second metallization plate 132 depicted in FIG. 4 includes a plurality of equi-sized and uniformly spaced rectangular fingers 133, other embodiments may employ differently configured fingered structures. Fingers 133 might, just as one of numerous possible examples, include a set of uniformly spaced "s"-shaped fingers, each separated by a uniformly wide gap 138.

As depicted in FIG. 4, second metallization plate 132 covers a substantial portion of the underlying structure with the conductive material and second metallization plate 132 employs a fingered configuration to address multiple fabrication and function considerations. The integrated MIM capacitor of which second metallization plate 132 is a part has a capacitance that is influenced by the area of second metallization plate 132, which suggests that an uninterrupted plate of metallization might be desirable to maximize the capacitance. The fabrication process employed to manufacture semiconductor devices that include a disclosed integrated MIM capacitor may, however, impose design and/or layout constraints including constraints on the maximum width, length, area, or coverage density of any metallization structure or set of metallization structures. In these fabrication processes, fingering employed in second metallization plate 132 may be required to ensure that second metallization plate 132 complies with any such constraints. The fingered arrangement of second metallization plate 132 beneficially leverages relatively strong and localized fringe effect electric fields inherent at the edges of a charged capacitor plate. The same may be true with respect to fingered embodiments, described below, of a first metallization plate 104.

In some embodiments, fingered metallization plates optionally employed in one or more of the metallization layers are configured to achieve a metallization coverage ratio at or close to a limit on coverage ratio that the semiconductor process can sustain. In these embodiments, the width of finger 133 is substantially greater than the finger gap 138 between adjacent fingers. In some semiconductor processes, a maximum ratio of finger width 136 to finger gap 138 is approximately 4:1 and the fingered structures optionally employed in first metallization plate 104 and second metallization plate 132 may exhibit the maximum width-to-gap ratios.

Routing element 134 emphasizes the integration of second metallization plate 132 into an existing metallization layer, second metallization level 130, of a semiconductor fabrication process. Second metallization level 130 may include multiple routing elements connecting various nodes and elements of integrated the semiconductor device.

Figure 5:
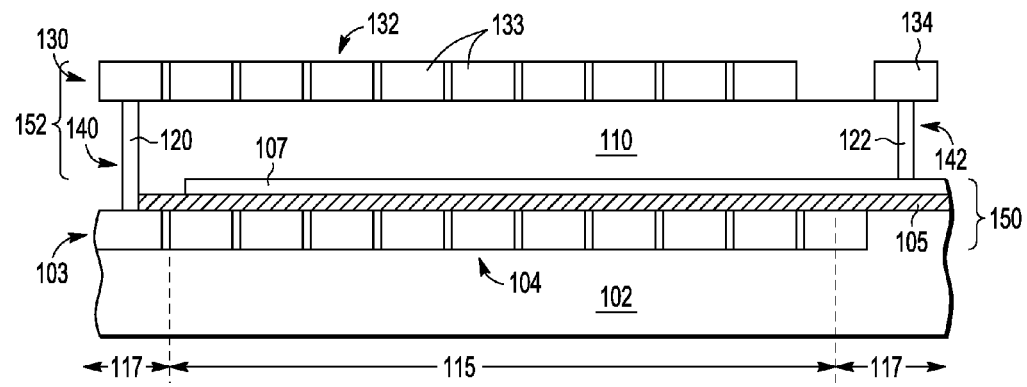
FIG. 5 is a partial cross-sectional representation of a second integrated MIM capacitor including a fingered structure.

Referring now to FIG. 5, a second embodiment of integrated MIM capacitor structure 100 employs finger structures in first metallization plate 104 as well as in second metallization plate 132. In this embodiment, a portion of first metallization level 103 within capacitor region 115 is patterned to produce first metallization plate 104 as a fingered structure that includes a configuration that is the same as or similar to the configuration of second metallization plate 132 as depicted in FIG. 4. Although the embodiment depicted in FIG. 5 depicts the two fingered structures of first metallization plate 104 and second metallization plate 132 as being of the same or substantially the same configuration, other embodiments may employ fingered structures for second metallization plate 132 that differ from the configuration of fingered structures in first metallization plate 104.

As depicted in FIG. 5, second metallization plate 132 is connected to first metallization plate 104 through first via 120 while MIM capacitor plate 107 is connected to routing element 134 of second metallization level 130 through via 122.

The implementations depicted in FIG. 3 and FIG. 5 may be described as including a first potential element 140 and a second potential element 142 to emphasize the electrical roles of each of the elements. Using this terminology, it will be appreciated that first potential element 140 has a single electrical potential (voltage) and second potential element 142 also has a single electrical potential. The two different potentials may be independently controlled to charge or discharge the integrated MIM capacitor structure 100.

As depicted in FIG. 5, therefore, integrated MIM capacitor structure 100 includes a first potential element 140 and a second potential element 142. First potential element 140 includes first metallization plate 104, the conductive via 120, and, in the depicted embodiment, the second metallization plate 132. In other embodiments described below with respect to FIG. 6 and FIG. 7, the second metallization plate 132 may be connected to the second potential element 142. Similarly, as depicted in FIG. 5, the second potential element 142 includes capacitor plate 107, second via 122, and, in the depicted embodiment, routing element 134 of second metallization level 130. In embodiments described below with respect to FIG. 6 and FIG. 7, the second potential element 142 does not include bridge routing element 125 of second metallization level 130.

Regardless of the specific implementation selected, integrated MIM capacitor structure 100 as described herein beneficially achieves improved capacitive density by configuring first metallization plate 104 and/or second metallization plate 130 with closely and densely spaced elongated fingers 133. When an electric potential is applied to first metallization plate 104 and second metallization plate 132, the electric fields will diverge at the edges of fingers 133 and create a fringe effect field the contributes to the overall capacitance of integrated MIM capacitor structure 100.

The embodiments of Integrated MIM capacitor structure 100 depicted in FIG. 3 and FIG. 5 may be characterized, modeled, or described as including a MIM capacitor 150 and a parasitic capacitor 152. Using this terminology, first metallization plate 104 serves as a first capacitor plate of MIM capacitor 150, MIM dielectric layer 105 serves as the MIM capacitor dielectric, and MIM capacitor plate 107 serves as a second MIM capacitor plate. With respect to parasitic capacitor 152, MIM capacitor plate 107 serves as the first parasitic capacitor plate, second metallization plate 132 serves as the second parasitic capacitor plate, and interlevel dielectric layer 110 functions as the capacitor dielectric of parasitic capacitor 152.

Figure 6:
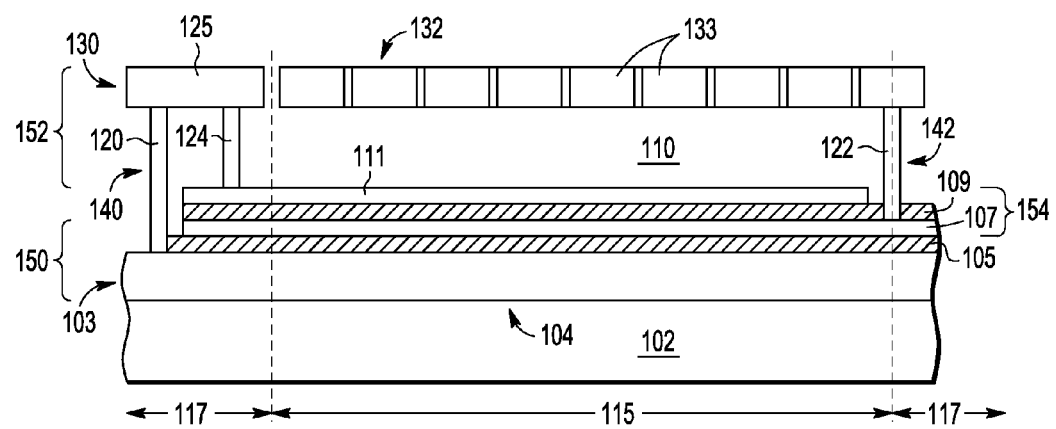
FIG. 6 is a partial cross-sectional representation of a third integrated MIM capacitor including a fingered structure.
Figure 7:
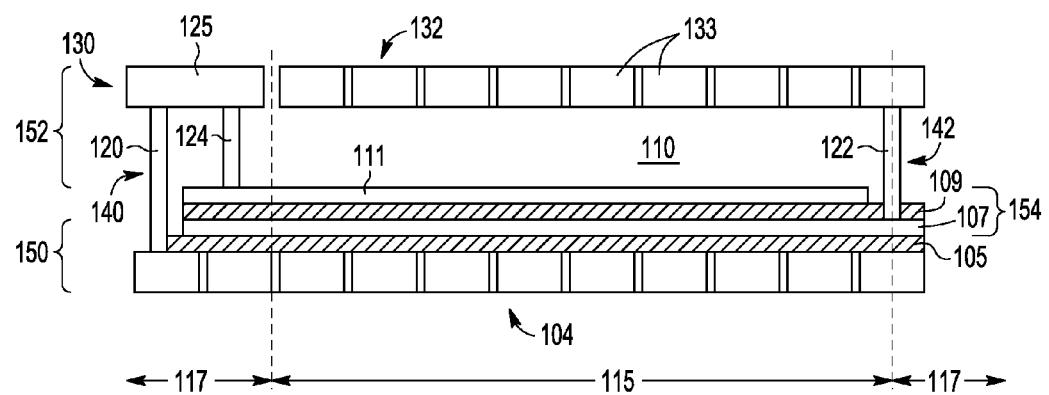
FIG. 7 is a partial cross-sectional representation of a fourth integrated MIM capacitor including a fingered structure.

Referring now to FIG. 6 and FIG. 7, depicted embodiments of integrated MIM capacitor structure 100 include an additional capacitor plate and a corresponding additional capacitor dielectric. The use of two dedicated capacitor plates in the embodiments of integrated MIM capacitor structure 100 depicted in FIG. 6 and FIG. 7 achieve a potentially higher value of capacitance at the cost of an additional photomask and lithography step.

As depicted in FIG. 6, integrated MIM capacitor structure 100 includes a substrate 102 and a first metallization level 103 overlying substrate 102 as in the integrated MIM capacitor structure 100 depicted in FIG. 3 and FIG. 5. The portion of first metallization level 103 within capacitor region 115 is a first metallization plate 104. First metallization plate 104 is configured as a conventional interconnect structure in the embodiment depicted in FIG. 6, but is configured as a fingered structure in the implementation depicted in FIG. 7. In some embodiments (not depicted), neither first metallization plate 104 nor second metallization plate 132 is fingered. In these embodiments, first metallization plate 104 and second metallization plate 132 may have structures of a rectangular or otherwise convex plate of metallization.

As depicted in both FIG. 6 and FIG. 7, integrated MIM capacitor structure 100 includes a first capacitor dielectric 105 overlying first metallization plate 104 within semiconductor region 115 and a first capacitor plate 107 overlying first capacitor dielectric 105. Unlike the integrated MIM capacitor structure 100 depicted in FIG. 3 and FIG. 5, the integrated MIM capacitor structure 100 depicted in FIG. 6 and FIG. 7 includes a second capacitor dielectric 109 overlying first capacitor plate 107, and a second capacitor plate 111 overlying second capacitor dielectric 109. The integrated MIM capacitor structures 100 of FIG. 6 and FIG. 7 include an electrical connection between first metallization plate 104 and second capacitor plate 111 and an electrical connection between first capacitor plate 107 and second metallization plate 132.

In the depicted embodiments, the electrical connection between first metallization plate 104 and second capacitor plate 111 is achieved through via 120, a bridge routing element 125 of second metallization level 130 and a via 124 connecting bridge routing element 125 to second capacitor plate 111. In the depicted embodiments, the electrical connection between first capacitor plate 107 and second metallization plate 132 is achieved through via 122.

In the depicted embodiments of FIG. 6 and FIG. 7, integrated MIM capacitor structure 100 includes a first potential element 140 and a second potential element 142. First potential element 140 includes first metallization plate 104 and second capacitor plate 111 connected through bridge routing element 125 and interlevel dielectric layer vias 120 and 124.

The second potential element 142 in the embodiments depicted in FIG. 6 and FIG. 7 includes the first capacitor plate 107 and second metallization plate 132 connected though the electrically conductive via 122.

The embodiments of integrated MIM capacitor structure 100 depicted in FIG. 6 and FIG. 7 may be characterized, modeled, or described as including three capacitors arranged in parallel. The three capacitors include a MIM capacitor 150, a parasitic capacitor 152, and a third capacitor 154 which may also be referred to as a second MIM capacitor. The three capacitors are in parallel because the voltage or potential applied across the capacitor plates of the three capacitors is the same. Using this terminology, first metallization plate 104 serves as a first capacitor plate of MIM capacitor 150, first MIM dielectric layer 105 serves as the MIM capacitor dielectric, and first MIM capacitor plate 107 serves as the second capacitor plate of MIM capacitor 150. With respect to parasitic capacitor 152, second metallization plate 132 serves as a first capacitor plate, interlevel dielectric layer 110 serves as the capacitor dielectric, and second MIM capacitor plate 111 serves as the second capacitor plate of parasitic capacitor 152. The third capacitor 154, includes first MIM capacitor plate 107, second MIM dielectric layer 109, and second MIM capacitor plate 111.

In the present document, the case where an integrated MIM capacitor 100 is formed between the first metallization level 103 and second metallization level 130 has been used as an illustration. However, an integrated MIM capacitor structure may be formed between any two of metallization layers that the fabrication process employs.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated MIM capacitor structure suitable for inclusion in a semiconductor device, the capacitor structure comprising:
   a first metallization level overlying a substrate, the first metallization level including a first metallization plate overlying a capacitor region of the substrate;
   a MIM capacitor, comprising:
      the first metallization plate;
      a MIM capacitor dielectric overlying the first metallization plate; and
      an electrically conductive MIM capacitor plate overlying the MIM capacitor dielectric; and
   a parasitic capacitor, comprising:
      a second metallization plate comprising a portion of a second metallization level overlying the capacitor region;
      a parasitic capacitor dielectric including an interlevel dielectric underlying the second metallization plate; and
      a parasitic capacitor plate underlying the interlevel dielectric;
   wherein a structure of the first metallization plate is selected from a fingered structure and a convex plate structure, a structure of the second metallization plate is selected from a fingered structure and a convex plate structure, and wherein the fingered structured includes a plurality of conductive fingers extending from a common connector;
   wherein the fingered structure includes a plurality of rectangular fingers, each having a finger depth and a finger length, each adjacent pair of fingers separated by a finger spacing; and
   wherein a ratio of a finger width to the finger spacing is approximately equal to 4.

2. The capacitor structure of claim 1, wherein the parasitic capacitor plate comprises the MIM capacitor plate.

3. The capacitor structure of claim 2, further comprising:
   an electrically conductive via connecting the second metallization plate to the first metallization plate; and
   a routing element comprising a portion of the second metallization level, wherein the routing element is connected to the MIM capacitor plate.

4. The capacitive structure of claim 1, wherein a metallization density of the fingered structure is approximately equal to 80%.

5. A semiconductor fabrication process, comprising:
   forming a first metallization level overlying a substrate including a capacitor region and a field region, the first metallization level including a first metallization plate overlying the capacitor region;
   forming a capacitor dielectric overlying the first metallization plate;
   forming a capacitor plate overlying the capacitor dielectric;
   forming an interlevel dielectric layer overlying the capacitor plate; and
   forming a second metallization level overlying the interlevel dielectric layer, the second metallization level including a second metallization plate overlying the capacitor region;
   wherein forming at least one of the first metallization level and the second metallization level includes a patterning of a metallization level to define a fingered structure, the fingered structure including a plurality of electrically coupled finger elements, wherein adjacent finger elements are separated by a minimum spacing;
   wherein the finger elements have a finger width; and
   wherein a spacing-to-period ratio of the fingered structure is approximately equal to 20%.

6. The semiconductor fabrication process of claim 5, further comprising:
   prior to forming the interlevel dielectric layer, forming a second capacitor dielectric overlying the first capacitor plate;
   forming a second capacitor plate overlying the second capacitor dielectric.

* * * * *